United States Patent [19]

Noon

[11] Patent Number: 5,530,624
[45] Date of Patent: Jun. 25, 1996

[54] CARD CONNECTOR INTERFACE GUIDE AND PRINTED WIRING BOARD ASSEMBLY SLIDE

[75] Inventor: Richard E. Noon, Hacienda Heights, Calif.

[73] Assignee: Xerox Corporation, Stamford, Conn.

[21] Appl. No.: 368,119

[22] Filed: Jan. 3, 1995

[51] Int. Cl.⁶ ................................................ H05K 1/11
[52] U.S. Cl. .................... 361/802; 361/752; 361/796; 439/74
[58] Field of Search ........................ 361/802, 752, 361/756, 796, 737, 803; 174/50, 17 R; 257/678; 439/74, 75, 62

[56] References Cited

U.S. PATENT DOCUMENTS 4,470,100  9/1984  Rebaudo et al. ..................... 361/413

Primary Examiner—Leo P. Picard
Assistant Examiner—Y. Whang
Attorney, Agent, or Firm—Nola Mae McBain

[57] ABSTRACT

A printed PWBA guide member 30 in which a card guide 22 and a slide 14 with a slot 34 for receiving a PWBA 10 are all integrated for ease of installation and alignment of the card guide 22 with a card connector 18 residing on the PWBA 10.

5 Claims, 3 Drawing Sheets

CARD CONNECTOR INTERFACE GUIDE AND PRINTED WIRING BOARD ASSEMBLY SLIDE

BACKGROUND

This invention relates generally to printed wiring boards and card connectors and more particularly concerns a printed wiring board assembly slide to which a card guide is attached for alignment and ease of insertion when a card is inserted into a card connector on the printed wiring board assembly.

When a circuit board is inserted inside a chassis, the circuit board and its associated card connector may reside a significant distance from a chassis opening or access port in the chassis through which to insert a card. Generally, a printed wiring board assembly is mounted on printed wiring board assembly slides to facilitate removal of the printed wiring board assembly for maintenance or system upgrades. When printed wiring board assemblies are mounted on slides, it is difficult to accurately align the printed wiring board assembly and the card connector with the access port in the chassis. Misalignment of the printed wiring board assembly and the card connector causes difficulty in insertion of the card through the access port and into the card connector, resulting in user frustration.

Past solutions to the problem of difficult card insertion have included molding the chassis into a funnel shaped guide to guide the card into the card connector, however, this does not address the problem of misalignment as the funnel shaped guide must still be aligned with the connector chassis opening.

Accordingly, is the primary aim of the invention to provide an improved design of a card guide which has fewer alignment problems and facilitates easy insertion of a card through the card guide, the chassis and into the card connector located on the printed wiring board circuit assembly.

Further advantages of the invention will become apparent as the following description proceeds.

SUMMARY OF THE INVENTION

Briefly stated, and in accordance with the present invention, there is provided a printed wiring board assembly (PWBA) guide member 30 in which a card guide 22 and a slide 14 with a slot 34 for receiving a PWBA 10 are all integrated for ease of installation and alignment of the card guide 22 with a card connector 18 residing on the PWBA 10.

While the present invention will be described in connection with a preferred embodiment and method of use, it will be understood that it is not intended to limit the invention to that embodiment/procedure. On the contrary, it is intended to cover all alternatives, modifications and equivalents as may be included within the spirit and scope of the invention as defined by the appended claims.

| NUMERIC LIST OF ELEMENTS | |
|---|---|
| 10 | PWBA |
| 12 | chassis |
| 14 | slide |
| 16 | slide |
| 18 | card connector |
| 20 | end plate |
| 22 | card guide |
| 24 | posts |
| 26 | chassis opening |
| 30 | PWBA guide member |
| 32 | rail-type projection |
| 34 | slot |

DETAILED DESCRIPTION OF THE INVENTION

Figure 1:
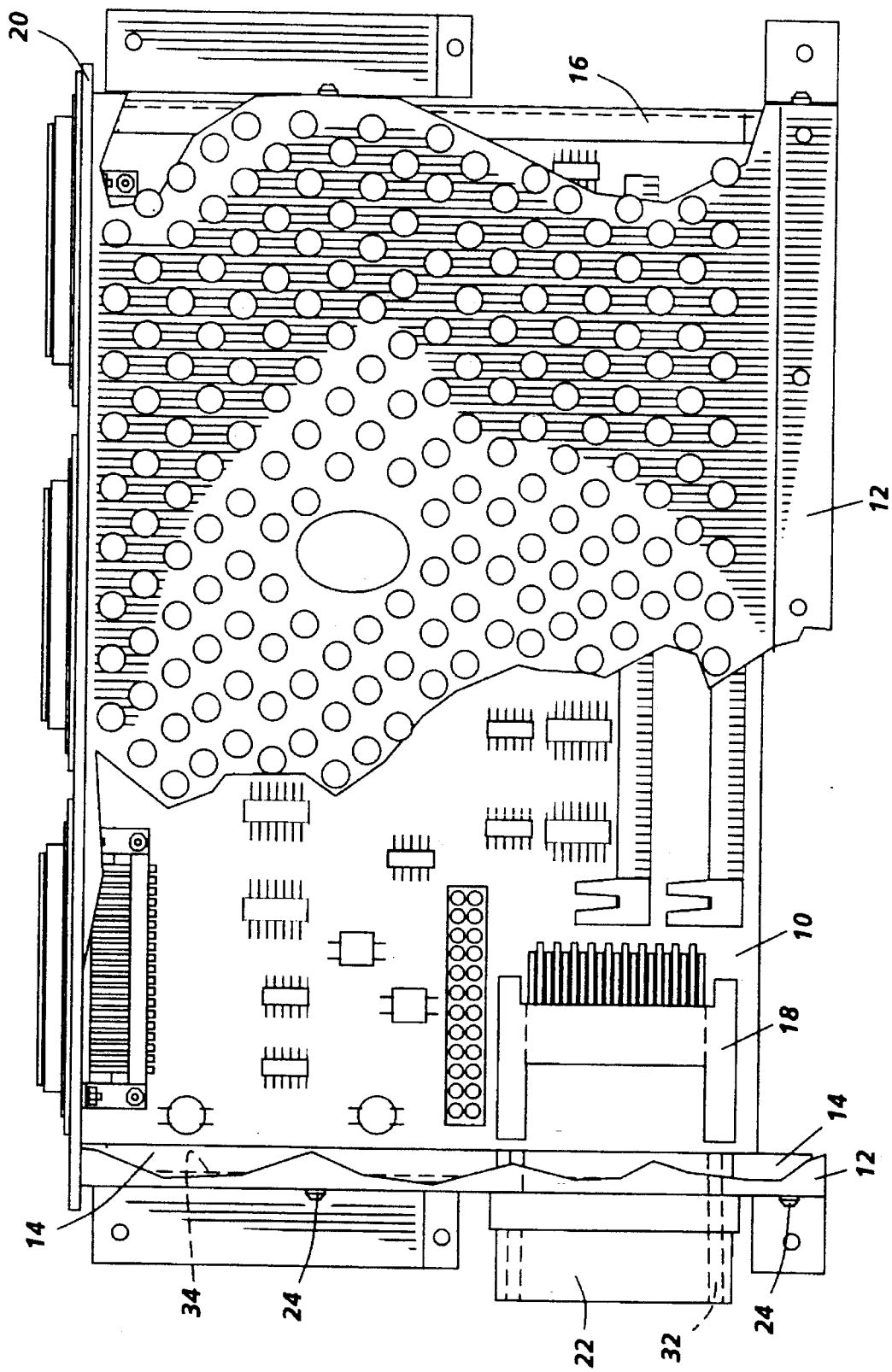
FIG. 1 shows printed wiring board assembly inserted into a chassis.

Turning now to FIG. 1, a printed wiring board assembly or PWBA 10 is inserted into a chassis 12 on slide 14 and slide 16. The cover of the chassis 12 has been broken away to facilitate viewing of the PWBA 10, the slide 14, and the slide 16. Residing on the PWBA 10 is a card connector 18. The PWBA 10 is mounted to an end plate 20. A card guide 22 projects through a chassis opening 26 (FIG. 2) in the chassis 12. Posts 24 are connected to slide 14 and are provided for fastening and aligning the slide 14 as they project through openings in the chassis 12.

FIG. 1 shows a complete assembly with the PWBA 10 completely inserted into the slide 14 and slide 16 and the card connector 18 aligned properly with the card guide 22. The PWBA 10 has been completely inserted in the slide 14 and the slide 16 when the PWBA 10 is prevented from further movement by the contact of the end plate 20 with the chassis 12.

Figure 2:
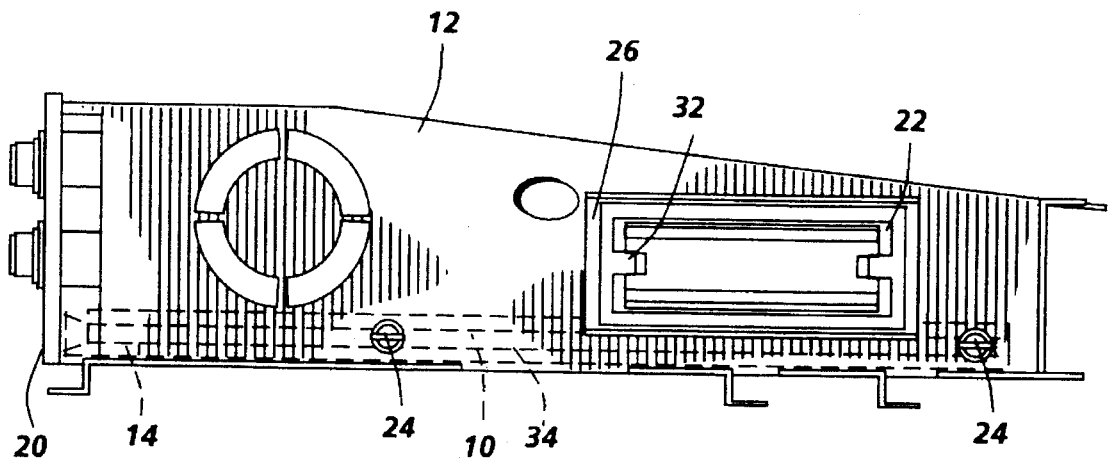
FIG. 2 shows a side view of the chassis shown in FIG. 1.

FIG. 2 shows a side view of the chassis 12 with the card guide 22 projecting through the chassis opening 26 in the chassis 12. The posts 24 can also be seen projecting through the chassis 12. The end plate 20 is shown fully inserted into the chassis 12. The internal placement of the slide 14 is also shown.

FIGS. 3 through 6 show a PWBA guide member 30 which includes the slide 14, the card guide 22, and the posts 24.

Figure 3:
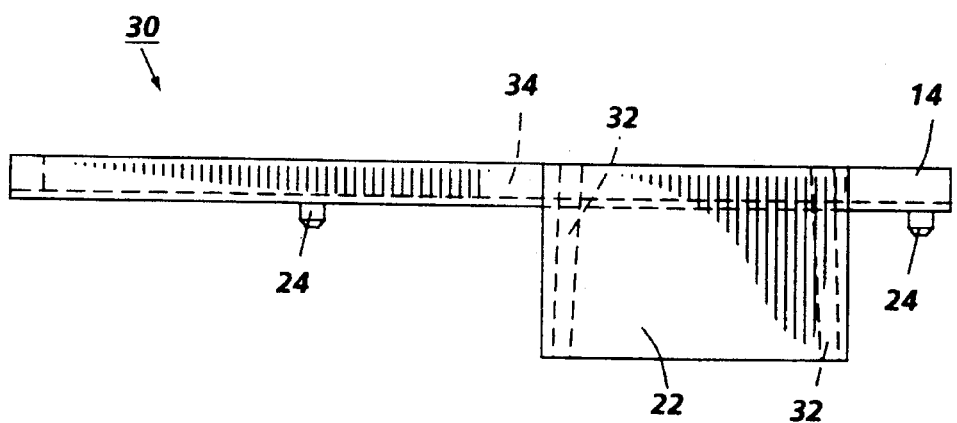
FIG. 3 shows a top view of a PWBA guide member.
Figure 4:
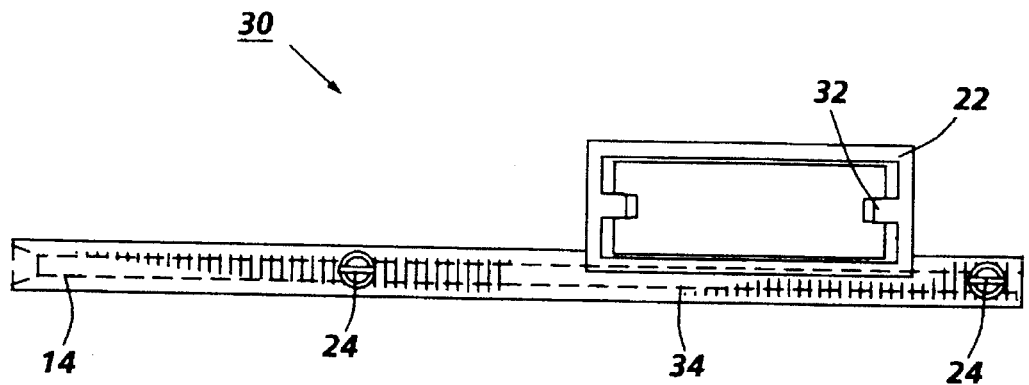
FIG. 4 shows a side view of the PWBA guide member shown in FIG. 3.

FIG. 3 is a top view showing the card guide 22 and the posts 24 projecting out from the slide 14. FIG. 4 is a front view of the PWBA guide member 30 showing the card guide 22 positioned slightly above the slide 14. The card guide 22 also has a rail-type projection 32 to guide a card as it is slid through the card guide 22. Using a rail-type projection 32 to guide a card through the card guide 22 is one particular guide embodiment. The specific guide embodiment used will depend on what particular type of card is being used. In this specific case, the card guide 22 was designed to be used with a Fujitsu FCN-565P136-G/0-V4 memory card.

Figure 5:
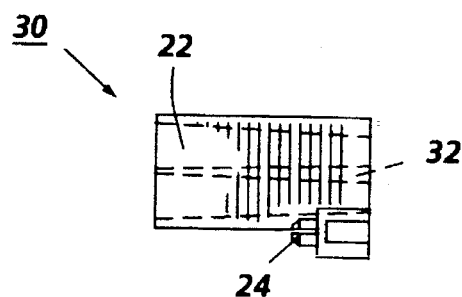
FIG. 5 shows an end view of the PWBA guide member shown in FIG. 3.
Figure 6:
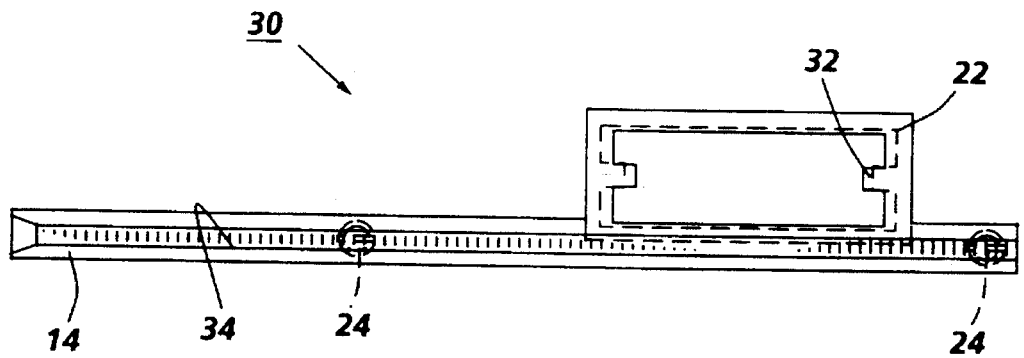
FIG. 6 shows a side view of the PWBA guide member shown in FIG. 3.

FIG. 5 shows a side view of the PWBA guide member 30. The relative sizes of the card guide 22 and the posts 24 can be seen. FIG. 6 shows a back vew of the PWBA guide member 30. A slot 34 running the length of the slide 14 is used to receive the PWBA 10.

Returning to FIG. 1, which shows a complete assembly with the PWBA 10 completely inserted into the slide 14 and slide 16 and the card connector 18 aligned properly with the card guide 22, it can be seen that there is only one critical alignment factor. That alignment factor is the distance from the posts 24 to the end plate 20, when the end plate is abutting to the chassis 12.

The end plate 20 provides a "stop function" when it contacts the chassis 12 which determines when the PWBA 10 is completely inserted into the slide 14. The "stop function" does not have to be provided by contact between the end plate 20 and the chassis 12 and could be provided by any other means such as a blockage in the slot 34 of the slide 14 itself which prevents further movement of the PWBA 10 in the slot 34. However, it is important to know how the "stop function" is being provided because that will determine what dimensions will be critical when the PWBA 10 is fully inserted into the slot 34 of the slide 14.

In this case, the critical dimensions affect alignment of the card connector 18 of the PWBA 10 with the card guide 22 of the PWBA guide member 30. With the card guide 22 an integral part of the PWBA guide member 30, precise alignment of the card connector 18 with the card guide 22 can be achieved by insuring that when PWBA 10 is inserted into the PWBA guide member 30 it stops in the correct, aligned position. With the end plate 20 stopping further insertion of the PWBA 10 into the PWBA guide member 30 when the end plate 20 contacts the chassis 12 correct alignment of the card guide 22 with the card connector 18 is maintained by correct installation of the PWBA guide member 30 in the chassis 12.

The PWBA guide member 30 is installed in the chassis 12 using the posts 24. The posts 24 are inserted through small holes machined in the chassis 12. Therefore the accuracy and placement of the holes in the chassis 12 are vital to the correct alignment of the card guide 22 with the card connector 18.

This is an improvement over prior art assemblies. The tolerances of the PWBA guide member 30 can be accurately controlled as well as the placement of the card guide 22 relative to the slide 14 during manufacturing of the PWBA guide member 30. The placement of the one part, the PWBA guide member 30, which has both the slide 14 and the card guide 22 integrated in it, reduces the number of parts which must be installed relative to each other and the number of tolerances which must be strictly controlled in the chassis 12, where they are the hardest to control. By reducing the problem to the installation of the PWBA guide member 30, correct alignment of the card guide 22 with the card connector 18 is easily effectuated.

I claim:

1. A printed wiring board assembly comprising a chassis having spaced apart guide members for slideably receiving a printed wiring board assembly therein and a chassis opening, one of said guide members being an elongated bar extending in one direction along said chassis, the bar having a groove in at least part thereof and extending in said one direction and facing the other guide member, a card guide, extending through said chassis opening, integral with said elongated bar extending in a direction substantially transverse to said one direction and having a card guide opening with internal guide means for receiving a card, the internal guide means being substantially transverse to said one direction, and securing means on said elongated bar and said chassis for fixing said one guide member to said chassis and locating means on said elongated bar and said chassis for precisely locating said one guide member relative to said chassis.

2. The printed wiring board assembly of claim 1 wherein said locating means comprises projections and openings through which the projections extend.

3. The printed wiring board assembly of claim 2 wherein said projections are located on said elongated bar.

4. The printed wiring board assembly of claim 1 wherein said one guide member is a plastic molded guide member.

5. The printed wiring board assembly of claim 1 further comprising a printed wiring board assembly received in said spaced apart guide members and having a card connector which is precisely aligned with the card guide.

* * * * *